United States Patent [19]

Ciszek et al.

[11] Patent Number: 4,594,229

[45] Date of Patent: Jun. 10, 1986

[54] APPARATUS FOR MELT GROWTH OF CRYSTALLINE SEMICONDUCTOR SHEETS

[75] Inventors: Theodore F. Ciszek, Evergreen; Jeffery L. Hurd, Golden, both of Colo.

[73] Assignee: Emanuel M. Sachs, Cambridge, Mass.

[21] Appl. No.: 238,234

[22] Filed: Feb. 25, 1981

[51] Int. Cl.$^4$ .............................................. C30B 15/34
[52] U.S. Cl. .................................................. 422/246
[58] Field of Search ............... 156/DIG. 80, DIG. 97, 156/617 SP, 617 H, 617 V, 608; 422/248, 249, 246

[56] References Cited

U.S. PATENT DOCUMENTS 3,303,319  2/1967  Steigerwald ................. 156/DIG. 80
3,729,291  4/1973  Bleil ............................ 156/DIG. 97
4,000,030  12/1976  Ciszek ......................... 156/617 SP

OTHER PUBLICATIONS

Ciszek et al, "Inexpensive Silicon Sheets for Solar Cells", published in NASA Tech. Briefs, Winter 1977, pp. 432–433.
Swartz et al., "The EFG Process Applied to Silicon Ribbons", published in J. of Electronic Materials, vol. 4, No. 2, 1975, pp. 255–279.
Ciszek, "EFG of Silicon Ribbons", published in Mat. Res. Bull., vol. 7, pp. 731–738, Jun. 1972.
Barrett et al, "Growth of Wide, Flat Crystals of Silicon Web", published in J. Electrochem. Soc.: Solid State Scien., Jun. 1971, pp. 952–957.

Primary Examiner—Hiram H. Bernstein
Attorney, Agent, or Firm—George W. Dishong

[57] ABSTRACT

An economical method is presented for forming thin sheets of crystalline silicon suitable for use in a photovoltaic conversion cell by solidification from the liquid phase. Two spatially separated, generally coplanar filaments wettable by liquid silicon and joined together at the end by a bridge member are immersed in a silicon melt and then slowly withdrawn from the melt so that a silicon crystal is grown between the edge of the bridge and the filaments.

4 Claims, 8 Drawing Figures

U.S. Patent    Jun. 10, 1986    Sheet 1 of 3    4,594,229
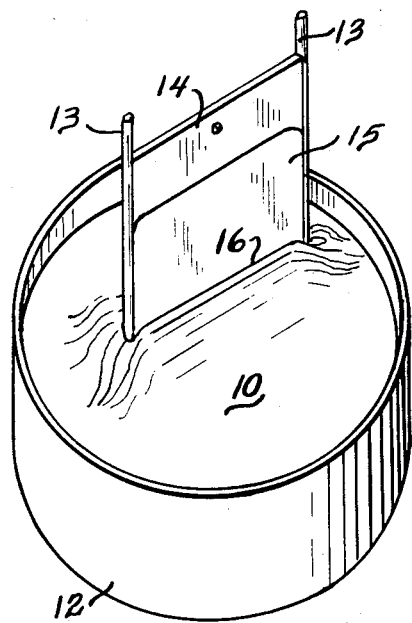
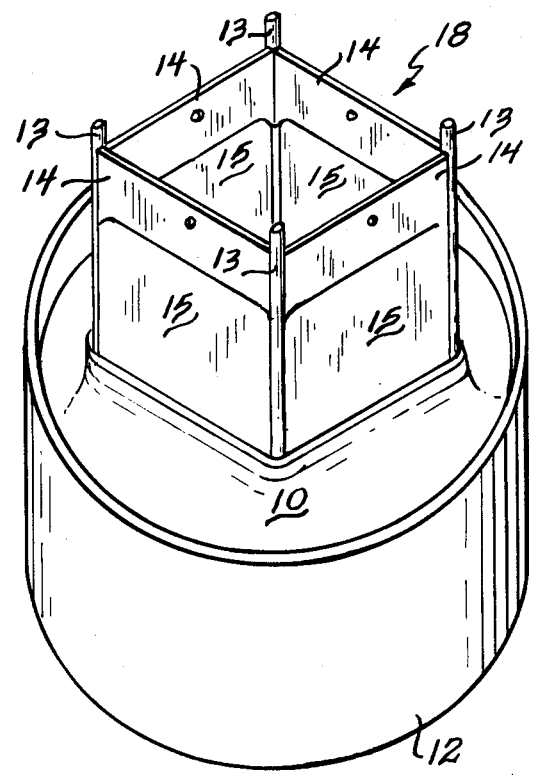
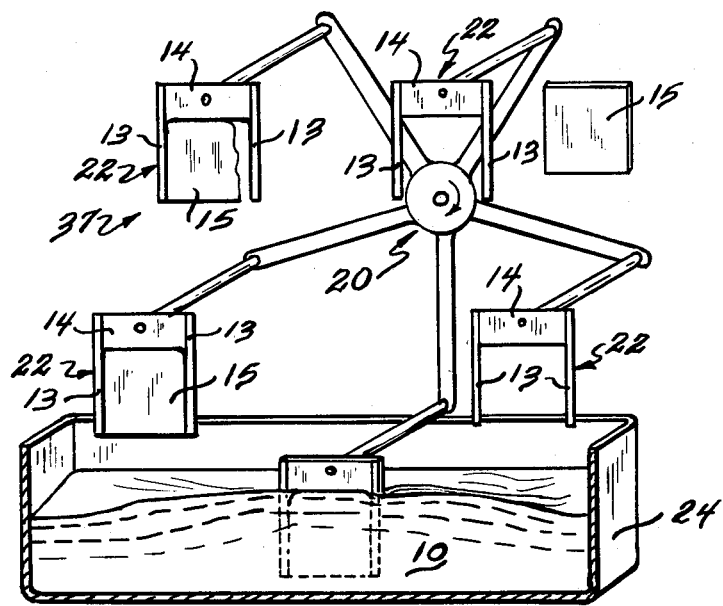

APPARATUS FOR MELT GROWTH OF CRYSTALLINE SEMICONDUCTOR SHEETS

CONTRACTUAL ORIGIN OF THE INVENTION

The United States Government has rights in this invention pursuant to Contract No. EG-77-C-01-4042 between the U.S. Government and Midwest Research Institute for operation of the Solar Energy Research Institute.

BACKGROUND OF THE INVENTION

It is well known that radiation of an appropriate wavelength falling on a p-n junction of a semiconductor is able to generate electron-hole pairs in the semiconductor. Because of the potential difference which exists at a p-n junction, electrons and holes move across the junction in opposite directions, creating a flow of electric current which can deliver power to an attached load.

Although most solar cells fabricated to date utilize silicon as the semiconductor material, cells have been prepared from other materials, such as cadmium sulfide and gallium arsenide. Silicon is preferred for several reasons: (1) it is a plentiful material and (2) the energy band gap of approximately 1.1 electron volts, responds quite favorably to electromagnetic energy having a wavelength in the visible and ultraviolet regions of the solar spectrum. The performance of silicon solar cells is particularly related to the degree of crystalline perfection of the semiconductor, since the flow of electrons is impaired by grain boundaries in the crystal. Thus, monocrystalline silicon exhibits the best performance, and this performance decreases upon addition of grain boundaries in a polycrystalline device. Thus, the smaller the grains, the greater the grain boundary density which impedes the current flow. In addition, the performance of silicon cells is affected by other defects such as increased level of impurities in the material and line dislocations.

Numerous methods have been developed to produce thin silicon solar cells. Unfortunately, economical production techniques have not been devised to prepare high quality silicon for such solar cells. Significant decreases in cost have been achieved to reduce the price of silicon solar cells, but more substantial cost reductions are required to make photovoltaics economically competitive with alternative sources of energy for uses other than remote applications, such as powering earth satellites.

Currently, silicon solar cells are manufactured in a multi-step process. Polycrystalline silicon is prepared by reducing trichlorosilane with hydrogen. Ingots of monocrystalline silicon are then grown from the polycrystalline starting material, and silicon wafers are prepared by cutting the resulting single crystal ingot to a thickness of at least 0.25 mm. Because of damage caused to the thin silicon wafer by cutting with a diamond saw, the silicon must subsequently be polished or etched to prepare the material for solar cell use. A dopant is then diffused into the silicon to form a shallow p-n junction, ohmic contacts are applied to the rear surface, grid contacts are attached to the diffused surface, anti-reflection and protective coatings are applied to the diffused surface, and the cell is mounted into position. Although it is apparent that this intricate procedure will necessarily result in high costs, many of the steps, particularly the latter ones, are essential. The crystal growth and sawing are the most expensive steps. Thus, efforts to reduce the cost of silicon solar cells have concentrated on less complex means to produce the thin silicon wafers prior to doping and final processing.

Three types of processes have been utilized to date to produce silicon crystals for fabrication into solar cells. In the Czochralski crystal growth method a seed crystal of silicon is immersed in a melt of formerly polycrystalline silicon contained in a quartz crucible. The seed crystal is slowly withdrawn, extracting with it a new, single crystal of silicon. As indicated in Table I, which compares various processes for producing silicon solar cells, crystalline growth by this process is slow and a high level of skill is required to implement this technique at the manufacturing level.

TABLE I

| PROCESS | CZOCHRALSKI CRYSTAL GROWTH | FLOAT ZONE | CASTING | EFG | DENDRITIC WEB GROWTH | RIBBON-RIBBON FLOAT ZONE | PRESENT INVENTION |
|---|---|---|---|---|---|---|---|
| Typical Growth Rate (mm/min) | 2 | 4 | ~6 | | ← ~30 →* | | |
| Max. Width Achieved (mm) | 150 | 100 | ~100 | 100 | 50 | 50 | 50 |
| Throughput Achieved (gms/min) | 80 | 70 | ~100 | 1-2 | → | → | →* |
| Crystal Structure | Single | Single | Multi-grained | Multi-grained | ~Single | Multi-grained | Large multi-grained |
| Technology-skill | High | Ex. High | Low | High | High | Ex. High | Low |
| Sawing Required | Yes | Yes | Yes | No | No | No | No |
| Other Process Problems | Possible Contamination by crucible. | Low yields/ difficult process to initiate/ delicate thermal control. | Small Grain Size | Delicate thermal control/ die contamination | Delicate temp. monitoring req'd, wide growth is difficult. | Delicate thermal control. | Contamination from filaments. |
| Solar Cell Efficiency | 16 | 16 | 11 | 11 | 15 | 9 | 13.8 |

TABLE I-continued

| PROCESS (%) | CZOCHRALSKI CRYSTAL GROWTH | FLOAT ZONE | CASTING | EFG | DENDRITIC WEB GROWTH | RIBBON-RIBBON FLOAT ZONE | PRESENT INVENTION |
|---|---|---|---|---|---|---|---|

*Growth rate and throughput are expected to be higher by a factor of approximately 20 in the horizontal growth mode.

A second method of forming silicon bars is the "float-zone" method. A rod of polycrystalline silicon is moved slowly downward through a heater to form a localized zone of molten silicon through the cross-section of the rod within the heater. A silicon seed crystal in contact with the liquid is slowly pulled downward to extract a single crystal of silicon from the melt zone. More of the polycrystalline rod is lowered into the melt zone as single crystal material is withdrawn from the bottom. Again, the level of skill required to move the polycrystalline rod and the seed crystal and to maintain a proper float zone is extremely high. As indicated in Table I, the rate of crystalline growth is quite low, approximately 4 mm/min.

In the third alternative, silicon bars may be formed by casting liquid polycrystalline silicon in a crucible, and then removing the solidified silicon from the crucible. In a variation of this casting process, liquid silicon is poured onto a rotating drum from which the solidified silicon ribbon is removed. Although the skill required for such a process is relatively low and silicon bar growth is faster than the two previously mentioned processes, the crystal end product is not as good as the first two methods discussed. The cast silicon product is characterized by small grain size, and solar cell efficiency is less than 70% of that demonstrated by the monocrystalline silicon wafers produced by the two methods just discussed.

To remove the necessity for sawing and polishing the silicon bars to produce semiconductor wafers adequate for solar cell use, attempts have been made to produce silicon in thin layers. Although silicon melts at 1415° C., it is malleable in a narrow temperature range in which it has a tendency to collect impurities easily. Thus, attempts to use conventional metallurgical techniques, such as rolling, to form thin silicon sheets have been unsuccessful and more sophisticated methods have been required.

One of these processes, the "ribbon-ribbon float zone" technique, is an adaptation of the float zone technique described previously with the substitution of polycrystalline silicon ribbon for the feedstock. While the resulting crystalline silicon film is easier to fashion into finished cells than the rod material, the use of the film increases the difficulty of process control in the delicate melt zone region. In addition, the laser heating techniques usually employed in this process are quite inefficient, and crystal quality is poor.

Another method utilized to make silicon ribbon is the edge defined, film-fed growth or "EFG" process which employs a silicon melt in a crucible much like the Czochralski process. In the EFG process, however, a die is placed in the melt so that part of the die extends above the liquid surface. Capillary forces cause the liquid silicon to rise through the internally defined spaces of the die, and crystalline silicon is slowly withdrawn by a seed crystal pulled from the top of the die. As illustrated in Table I, the EFG process achieves significantly higher pulling rates than the Czochralski method, but the product is a multi-grained crystalline structure which substantially reduces solar cell efficiency. In addition, delicate temperature control is required at the top of the die. Too much heat will increase liquidity and cause separation of the silicon melt from the seed crystal; too little heat will cause the silicon to freeze in the die. For silicon capillary rise, the die material should be wettable by silicon which usually means the material is also soluble in the silicon. For example, graphite, a typical die material, dissolves in and contaminates silicon.

Finally, attempts have been made to produce thin films of silicon by "dendritic web growth". In this technique a supercooled melt of silicon is prepared, i.e., the temperature at lower layers of the melt are cooler than the surface of the melt. A single dendritic crystal is inserted in the melt and slowly withdrawn to form a web of crystalline material. This technology is set forth by Barrett, D. L., Myers, E. H. Hamilton, D. R., Bennett, A. I.: J. Electrochem. Soc. 118, 952 (1971). This technology is extremely difficult to execute, particularly in maintaining proper control over the supercooled silicon melt.

Thus, it is an object of this invention to produce thin, crystalline semiconductor sheets suitable for use in photovoltaic devices while avoiding the difficulties of the prior art.

It is also an object of the present invention to produce high quality crystalline silicon sheets by a process employing relatively unsophisticated semiconductor technology which is capable of being mechanized for continuous operation.

It is another object of the invention to provide an apparatus which is of simple construction and is able to produce crystalline semiconductor sheets suitable for use in solar cells without excessive finishing steps.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In the present invention, a capillary film of liquid silicon is formed between two filaments immersed in the liquid. The filaments are pulled away from the liquid, solidifying the region of the film between the filaments in a continuous fashion. The film or meniscus is replenished continuously by capillarity. The meniscus is bounded by the melt surface, the filaments, and the newly crystallized sheet edge. The process is capable of being mechanized in numerous ways so that the thin film of crystalline silicon can be formed continuously or in large scale batch operations.

BRIEF DESCRIPTION OF THE DRAWINGS

FIG. 1 depicts the basic principles of the invention in preparing a thin sheet of large grained crystalline silicon material from a silicon melt.

FIG. 2 illustrates another embodiment of the invention in which multiple sheets of large grained crystalline silicon are prepared simultaneously.

FIGS. 3 and 4 are schematics illustrating two alternate embodiments of the invention in which large grained crystalline sheets are prepared in a mechanized process.

DETAILED DESCRIPTION OF THE PREFERRED EMBODIMENTS

Figure 4:
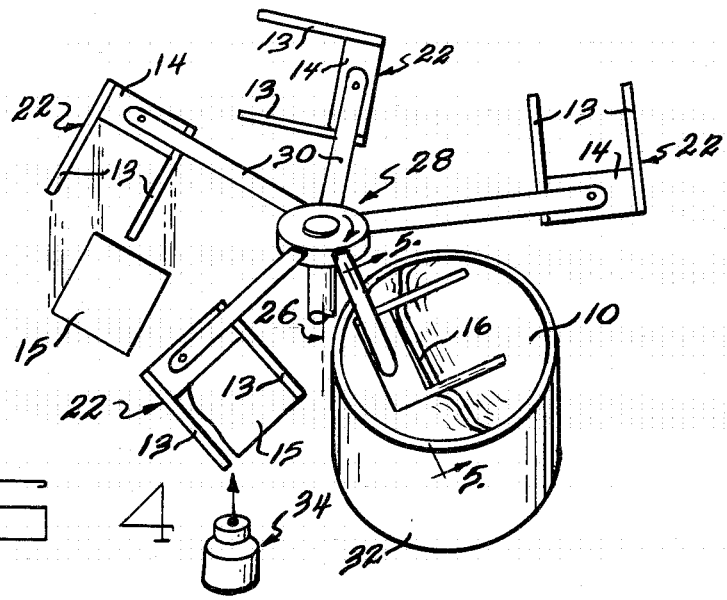

A method and apparatus has been developed for forming thin sheets of crystalline silicon suitable for use in photovoltaic devices that obviates many of the basic disadvantages of prior art processes. Specifically, we have found that a meniscus of liquid silicon is formed between two filaments immersed in the liquid material. The filaments are held rigidly by a solid connecting means above the liquid silicon. The connecting means also aids in the initial formation of the meniscus. As the filaments are pulled away from the liquid silicon, the film solidifies between the filaments in a continuous fashion to form a sheet of crystalline silicon. Optimally the rate at which the filaments are pulled from the liquid is the same as the rate at which the silicon liquid solidifies. As the filaments move away from the melt, the liquid film or meniscus, which is bounded by the melt surface, the filaments on either side, and the newly crystallized sheet edge, is replenished by capillary action from liquid silicon in the melt.

The basic principles of the present invention are shown schematically in FIG. 1. Crucible 12 contains a melt 10 of liquid silicon which is maintained in the liquid state by any means well known in the art. Into the melt are immersed two coplanar, spaced-apart filaments 13 which are connected by a bridge 14 to support and maintain the filaments 13 in the proper position relative to one another. In a preferred embodiment of the invention the bottom portion of bridge 14, i.e., that portion which would first contact the liquid as the filaments are lowered into the liquid, comprises a seed crystal of solidified silicon. Initially, the filaments are submerged sufficiently into the liquid melt so that the bottom portion of bridge 14, or the seed crystal in the preferred embodiment, contacts the upper surface of the melt 10. It is understood that while a filament-type structure, such as filament 13 is preferred, it is envisioned that other support structures such as plates or the like may be utilized therefor in the present invention.

Once the contact between the bridge 14 and the melt 10 has been established, a meniscus 16 of liquid silicon is formed between the melt 10 in the crucible, the filaments 13, and the bridge or seed crystal 14. The filaments 13 and bridge 14 may be withdrawn from the melt 10 at any rate which does not disrupt the forces holding the meniscus 16 to its boundaries, thus, avoiding the breaking away of the meniscus from the crystalline silicon 15 or which does allow dissipation of the heat of crystallization. As the filaments 13 are withdrawn, the liquid in the meniscus 16 cools and begins to solidify into crystalline silicon 15 in the growth area between filaments 13. Initially, solidification occurs at the bottom of the bridge or seed crystal 14 and continues further as cooling occurs incident to retraction of the filaments 13 from the melt 10. At all times there is a liquid meniscus 16 connecting the most recently crystallized section of silicon 15 with the melt 10 in the crucible 12.

After the filaments 13 have been completely withdrawn from the melt 10 and the crystalline silicon 15 has been solidified, the silicon 15 may be removed from the filaments 13 and bridge 14 by any conventional technique, such as laser trimming along the boundaries of the crystalline silicon sheet 15 and filaments 13 and bridge or seed crystal 14. The silicon sheet 15 can then be fabricated into one or more suitable solar cell wafers by doping it with a suitable material, as known in the art, to form a p-n junction. The contacts are attached to the surface of the cell, and the cell is mounted in a collector array. Depending on the size of the crystalline silicon sheet 15 formed in the process, multiple cells can be formed by slicing the sheet 15 into appropriate sized cells at a suitable stage of the processing in accordance with known techniques.

The filaments 13 and bridge 14 employed in the present invention may preferably be made of any material which is wettable by liquid silicon and durable in contact with it. Preferred materials at the present time include graphite, quartz, or silicon carbide. For example, metallic wires could be coated with a thin layer, i.e., less than 0.2 mm, of silicon carbide applied by chemical vapor deposition. The only geometric restriction for the filaments 13 are that the molten material 10 must preferably wet the filament 13, and the filaments 13 must be able to sustain a crystalline sheet formed between the adjacent filament members. However, experimentation with quartz ($SiO_2$) fibers, which have nearly neutral wettability for silicon, has revealed the feasibility of using materials which have borderline wettability.

The filaments 13 should be arranged generally coplanar to one another as they are withdrawn from the silicon melt 10 to maintain the integrity of the meniscus 16 at all times. In batch processes, such as that shown in FIG. 1, this may be accomplished with the use of the bridge member 14. However, the filaments 13 need not be parallel in batch processes. For example, triangular or other polygonal shapes and even discs could be solidified. In continuous processes, such as those to be described herein, substantially parallel alignment of filaments 13 at the point of withdrawal from silicon melt 10 may be achieved by properly located guides. The filaments 13 may be spaced as far apart from each other as possible and at variance from the coplanar orientation to the extent consistent with maintenance of the meniscus 16 of liquid silicon between them. To date widths of up to 5 cm have been successfully used to produce silicon crystals by the present invention.

As noted previously, in a preferred embodiment of the invention at least the lower portion of bridge 14 connecting the filaments 13 comprises a silicon seed crystal. In a preferred embodiment of the present invention the silicon seed crystal is oriented such that {111} planes of the crystal will intersect the surface of the solidified silicon crystal sheet 15 in lines which are parallel to one of the filaments 13. It has been found that when the seed crystal is oriented in this manner, the process yields an improvement of the grain size of the resulting silicon crystal formed from the silicon melt.

The silicon melt 10 necessarily should be maintained at a temperature above the 1415° C. melting point of silicon. Based on experience, temperature adjustments are determined by visually observing the radius of curvature of the boundary between the meniscus 16 and sheet 15 near the filaments. When the radius is too small it indicates that the temperature of the melt is too high or the pulling rate is too high and that the meniscus may separate from the sheet. A large radius indicates that the temperature of the melt is too low or that the pulling rate is too slow and this may cause the solidifying sheet 15 to thicken. Normally, it is sufficient that the silicon be drawn into a thermal environment maintained by ambient room temperature conditions. However, it may be possible to accelerate the crystal pulling speed by artificially imposing a cooling zone immediately adjacent to the surface of the melt 10, thereby providing rapid solidification of the most remote portion of meniscus 16. After this immediate cooling, the crystalline silicon should be subsequently cooled gradually to prevent thermal stress formation in sheet 15.

The present invention has several important advantages over the prior art processes. One major advantage is process simplicity: sophisticated technology, monitoring techniques, and process controls are not required in the present invention with resulting advantages in equipment, process reliability, and skill required for process operators. Second, the product of the present process is a thin silicon wafer rather than a bulky silicon ingot. The latter material requires expensive and energy intensive sawing techniques to reduce the silicon material to wafer form with attendant material losses. Thus, several expensive and wasteful process steps are eliminated by the ability of the present process to produce directly wafer thin silicon crystals. To date silicon crystals 15 having a thickness from 0.12 mm to 1 mm have been produced directly without the need for slicing.

In addition, the solar cells prepared from crystalline silicon sheets 15 of the present invention are of high quality, having a large grain size and a sufficient surface finish (not generally requiring polishing prior to cell manufacture). Although the product is not a monocrystalline material, the grain size is significantly larger than other polycrystalline silicon cells produced by prior art processes. When the crystal growth is initiated by seeding with appropriately oriented seed crystals, grain sizes as large as 620 mm$^2$ have been obtained. This crystalline structure has significantly improved solar cell efficiencies. To date efficiencies as high as 13.8% (or 91% of the more expensive Czochralski silicon cells) have been obtained.

The foregoing advantages are emphasized by another, and perhaps the most significant, attribute of the present invention—its susceptibility to the continuous production of thin crystalline silicon sheets for photovoltaic use. Whether embodied in repetitive batch operations or continuous flow processes, this advantage of the present process should significantly decrease the cost of producing silicon solar cells. Examples of alternative means by which the present invention can be adapted for rapid production of silicon sheets are shown in FIGS. 2, 3, 4, 6, 7, and 8.

FIGS. 2 through 4 illustrate batch processes for producing silicon sheets by the present invention. In FIG. 2, multiple sheets of crystalline silicon are prepared in essentially the same manner as described with respect of FIG. 1. To improve the production rate four fibers 13 are joined together in an assembly 18 having a box-like configuration by bridge members 14, so that when the entire assembly 18 is introduced in silicon melt 10 disposed in crucible 12 and withdrawn, as previously described, four sheets of crystalline silicon 15 are formed. Other arrays employing any number of substantially parallel fibers could be formed to produce multiple thin sheets of crystalline silicon at the same time in this manner. When multiple sheet arrays are used, it is necessary to balance the surface tension forces across each sheets' liquid/solid interface.

Repetitive batch processes for producing thin silicon sheets by the present invention are depicted in FIGS. 3 and 4. In FIG. 3, a Ferris wheel-like device 20 contains a number of film growing supports 22 containing parallel filaments 13 joined by bridge 14. As the wheel rotates, supports 22 comprising filaments 13 and bridge 14 are sequentially immersed in a silicon melt 10 contained in crucible 24. Further continuous movement of the wheel sequentially removes each support 22 from the melt 10 to form thin silicon sheets 15 in the growth area between the filaments 13 and the bracket 14. At a subsequent point in the movement of the wheel, each support 22 containing an attached silicon sheet 15 passes through a work station at 37 where the silicon is cut and removed from the support 22. The support 22 is returned to the silicon melt 10 to reinitiate the cycle.

In FIG. 4 a similar process is disclosed, except that rotation is conducted in a substantially horizontal, rather than vertical, plane around axis 26. A structure 28 is depicted schematically containing multiple arms 30 having crystal supports 22 constructed as described in FIG. 3. These supports 22 are passed, essentially in a horizontal plane, through the uppermost portion of the silicon melt 10 contained in a crucible 32 to form a crystalline silicon sheet 15 on each support 22. The support 22 then passes through a work station having, for example, a laser scriber 34 wherein the crystal 15 is cut from the filaments 13 and connecting bracket 14. The crystal is subsequently removed, and the support is then returned sequentially to the melt 10 to form a new crystalline silicon sheet 15.

Figure 5:
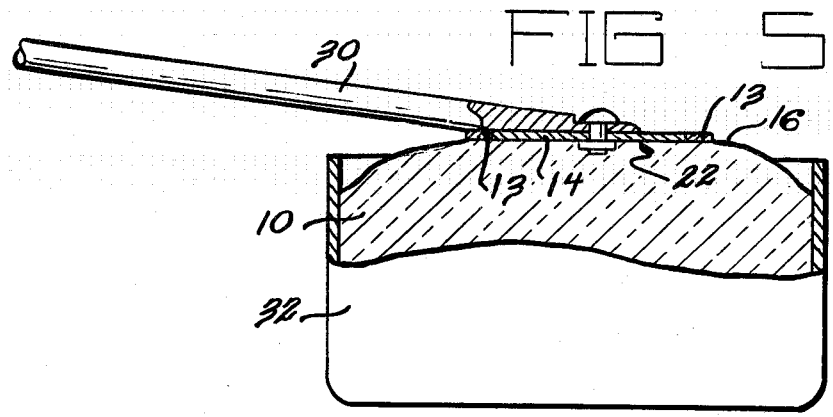
FIG. 5 is a partial cross-sectional view, with some parts in elevation, taken substantially along line 5—5 of FIG. 4.

Although the processes of FIGS. 3 and 4 appear to be essentially the same, the process depicted in FIG. 4 is preferred since it can be conducted at a faster rate when performed horizontally rather than vertically. In FIG. 5 the crystal forming process of FIG. 4 is illustrated in which the support 22 comprising parallel filaments 13 joined by bracket 14, is withdrawn nearly horizontally from crucible 32 containing a melt 10 of silicon maintained at brim level. The advantage of this nearly horizontal growth of the silicon crystal is that there is a large area solid/liquid interface defined by area $Y \times Z$, where Y is the length of dimension along filaments 13 in contact with the melt and Z is the width between filaments 13. This is in contrast to an interface area defined by $t \times Z$ using vertical pulling as shown in FIGS. 1-3, wherein t is the sheet thickness and Z is again the distance between filaments 13. Thus, the horizontal removal method allows better removal of the heat of fusion and much faster crystal growth. Accordingly, in a preferred embodiment of the invention, the substantially parallel filaments 13 are removed from the silicon melt at an angle of less than approximately 15° to the plane of the melt surface and, more preferably, as close to 0° as possible.

Figure 6:
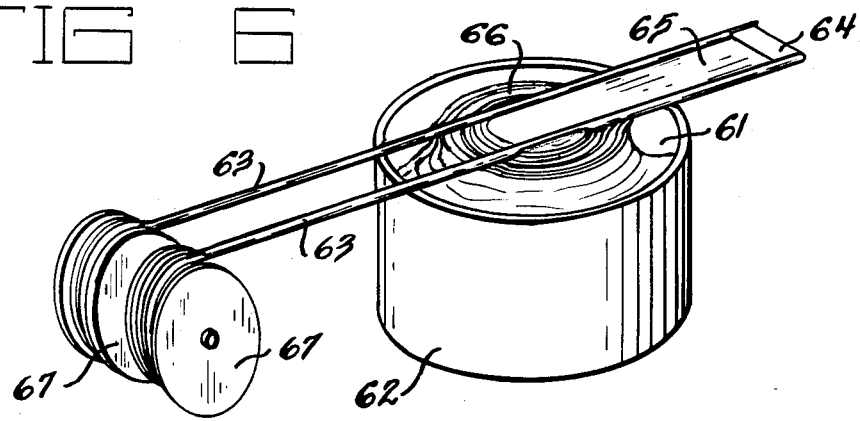
FIG. 6 is a schematic illustrating yet another embodiment in which the present process is adapted for the continuous preparation of large grained crystalline silicon.
Figure 8:
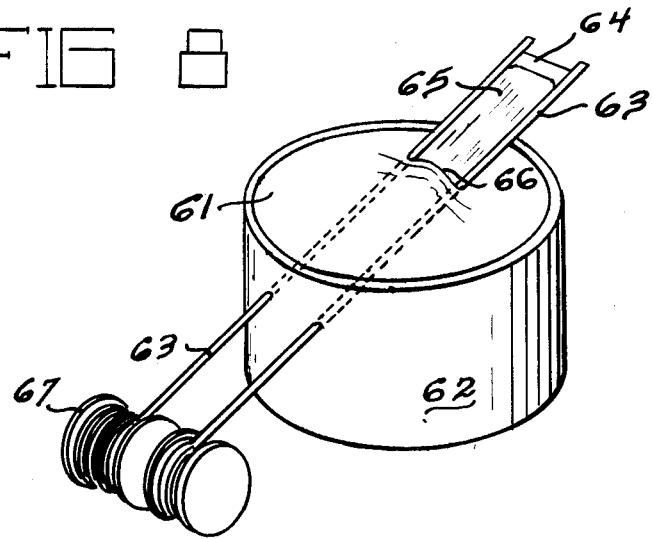
FIG. 8 is a variation of the embodiment shown in FIG. 6 and is another embodiment for the continuous preparation of silicon sheets.

FIG. 6 and FIG. 8 disclose particularly advantageous embodiments of the present invention which utilizes nearly horizontal formation of the silicon crystals on a continuous basis. In the processes illustrated in FIG. 6 and FIG. 8, filaments 63 are joined together by bridge 64 and pulled in parallel arrangement from twin spools 67. The filaments 63 and bridge 64 are brought in contact with the surface of silicon melt 61 in crucible 62 to form meniscus 66. Guides, not shown, are preferably used to maintain the proper coplanar relationship of the filaments 63 in contact with the meniscus 66. As the filaments 63 are moved away from the melt 61, in as nearly a horizontal path as possible, a crystal sheet 65 is formed. This sheet 65 may be flexible enough that the sheet 65 and attached filaments 63 can be rewound on another spool for ease in handling or storage. The silicon sheet 65 can then be separated from the filaments 63 and processed into silicon solar cells as previously described.

Figure 7:
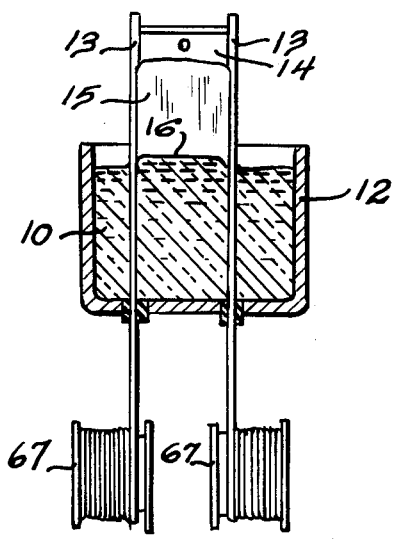
FIG. 7 is a variation of the process shown in FIG. 1, that illustrates another embodiment adopted for continuous preparation of silicon sheets.

FIG. 7 discloses the process shown in FIG. 1, however, it has been modified to allow for the filaments to be continuously pulled from twin spools as explained above for FIG. 6 and FIG. 8.

It should be readily understood that the processes depicted in FIGS. 2, 3, 4, 6, 7, and 8 are only illustrative of possible configurations and techniques for conducting the present invention on a continuous or batch basis. Other arrangements and techniques can also be employed to take advantage of the basic features of the invention, and the invention may be utilized to prepare thin sheets of other photovoltaic materials, such as gallium arsenide, indium phosphide, or cadmium telluride. The same basic principles should apply with respect to each of these materials of edge supporting filaments wettable to the particular melted material are utilized.

To more specifically illustrate the present invention, the following examples are provided:

EXAMPLE I

Two graphite filaments were formed by cutting out the central 29 mm region of a 32 mm wide graphite sheet to a length of 30 mm from one end. The other solid end of the sheet was retained to serve as the bridge member and to support the filaments which were approximately 30 mm long, 1.3 mm wide, and 0.5 mm thick. The end of the support member with the spaced coplanar filaments was then dipped into molten silicon at approximately 1450° C. and withdrawn at about 10 mm/min. The resultant silicon sheet was analyzed as having grains as large as 20 mm$^2$. Eight silicon photovoltaic cells were subsequently prepared utilizing such silicon sheets and known standard techniques. When these cells were tested under AM1 illumination, they demonstrated efficiencies of 7.4 to 12.6 percent with an arithmetic average efficiency of 10.0.

EXAMPLE II

Two graphite filaments were prepared as in Example I, but were joined together in coplanar arrangement at an intervening distance of 50 mm by the graphite bridge member. At the base of the bridge a silicon seed crystal with a (011) face was mounted with {111} planes parallel to the graphite filaments and perpendicular to the sheet surface. The end with the filaments was then dipped into molten silicon so that the meniscus contacted the seed crystal. A withdrawal rate of about 16 mm/min was used and grains as large as 620 mm$^2$ were obtained in the resultant silicon sheet. Five samples of silicon sheets prepared in this manner, using pulling rates between 10 and 26 mm/min, were tested under AM1 illumination and demonstrated photovoltaic efficiencies ranging from 10.1 to 13.8 percent with an arithmetic average of 13.0 percent.

It will be understood that while the examples and specific embodiments described above are illustrative of the invention, the present invention is not to be limited or restricted thereby and is to be defined only by the appended claims.

The embodiments of the invention in which an exclusive property or privilege is claimed are defined as follows:

1. An apparatus for growing crystals from a reservoir of a molten material comprising:
   at least two spaced filaments;
   bridging means interconnecting said spaced filaments;
   said spaced filaments and bridging means being wettable by said molten material; and
   an emersion-removal means comprising a rotation assembly having a plurality of arms radiating from a common center, each of said arms supporting at least a pair of said filaments connected by said bridging means, said emersion-removal means being adapted to emerse and remove said spaced filaments and bridging means from said molten material to form a continuous crystalline sheet of said material within the bounds of a growth area defined by said spaced filaments and bridging means upon removal thereof from said molten material.

2. The apparatus of claim 1 wherein said rotation assembly rotates in a substantially vertical plane, thereby inserting and removing said filaments and connecting said bridging means in the vertical plane.

3. The apparatus of claim 1 wherein said rotation assembly rotates in a substantially horizontal plane, thereby inserting and removing said filaments and connecting bridging means in the horizontal plane.

4. The device of clalim 3 wherein the angle is less than 15° of arc between the plane formed by each pair of said filaments and the plane of the surface of the reservoir of molten subject material.

* * * * *